United States Patent [19]
Minami et al.

[11] Patent Number: 5,578,971
[45] Date of Patent: Nov. 26, 1996

[54] AMPLITUDE MODULATION CIRCUIT AND METHOD

[75] Inventors: Michitoshi Minami; Yutaka Kojima, both of Mitaka; Kazuhisa Hayeiwa; Hisashi Naka, both of Tokyo, all of Japan

[73] Assignees: Japan Radio Co., Ltd., Mitaka; Nippon Hoso Kyokai, Tokyo, both of Japan

[21] Appl. No.: 578,236

[22] Filed: Dec. 26, 1995

[30] Foreign Application Priority Data

Jan. 31, 1995 [JP] Japan .................................. 7-014506

[51] Int. Cl.⁶ .............................. H03C 1/00; H03F 3/24
[52] U.S. Cl. .......................... 332/149; 330/10; 455/108
[58] Field of Search ............................ 332/149, 170, 332/171; 330/10; 455/108, 109

[56] References Cited

U.S. PATENT DOCUMENTS

| | | | |
|---|---|---|---|
| 3,480,881 | 11/1969 | Boykin | 332/149 |
| 4,403,197 | 9/1983 | Swanson | 330/10 |
| 5,111,158 | 5/1992 | Malec et al. | 330/10 X |
| 5,132,637 | 7/1992 | Swanson | 330/10 |
| 5,450,444 | 9/1995 | Miki et al. | 332/149 X |

FOREIGN PATENT DOCUMENTS

| | | |
|---|---|---|
| 0218152A1 | 4/1987 | European Pat. Off. . |
| 0349732A1 | 1/1990 | European Pat. Off. . |
| 0572974A1 | 12/1993 | European Pat. Off. . |
| 5-63458 | 3/1993 | Japan . |

OTHER PUBLICATIONS

"Digitally Implemented Medium Frequency Transmitter And Its Application", Shinya Hirano, *Hoso Gijutsu,* pp. 119–125 (Apr. 1991 Issue).

*Primary Examiner*—David Mis

[57] ABSTRACT

An amplitude modulation circuit and method. A predetermined number of (e.g., 6) drivers and differentially switched power amplifiers are provided in pairs. A program sound signal which has been quantized into a predetermined number of bits (e.g., 12 bits) is divided through a ROM into a plurality of bit groups each consisting of a predetermined number of bits (e.g., 2 bits), which are in turn distributed to the respective driver and differentially switched power amplifier pairs. In response to the value of the distributed bit group, each driver selects two different phase-shift carriers from seven different phase-shift carriers, and provides as its outputs $\phi_A$ and $\phi_B$. With the output phase-shift carriers ($\phi_A$ and $\phi_B$), each driver differentially switches the differentially switched power amplifier corresponding thereto. The output of each differentially switched power amplifier is weighted. The outputs of all the differentially switched power amplifiers are combined by a power combiner and then filtered through a BPF, thereby obtaining a broadcast output which has been amplitude modulated by the program sound. Thus, a digital amplitude modulation can be realized using a lower number of power amplifiers than before.

9 Claims, 5 Drawing Sheets

AMPLITUDE MODULATION CIRCUIT AND METHOD

BACKGROUND OF THE INVENTION a) Field of the Invention

The present invention relates generally to an amplitude modulation circuit and method using power amplifiers, and more particularly to an amplitude modulation circuit which contributes to down-sizing, power saving, and improvement in quality of a full solid state MF (medium frequency) radio broadcaster. The present invention relates further to an amplitude modulation circuit applicable to a wide variety of broadcasters ranging from low power of 100 watts output level to medium and high power.

b) Description of the Related Arts

A typical digital amplitude modulation circuit suitable for a full solid state MF radio broadcaster is described in, for example, HOSO GIJUTSU, April, 1991. This circuit includes a total of 48 power amplifiers, that is, 42 big step modules and 6 binary modules. The binary modules have respective outputs equal to $½$, $¼$, $⅛$, $1/16$, $1/32$ and $1/64$ of those of the big step modules. A 12-bit digital signal is derived from A/D (analog-to-digital) conversion of an input program sound signal, 6 bits on the MSB (most significant bit) side being used for on/off control of outputs of the 42 big step modules and 6 bits on the LSB (least significant bit) side being used for on/off control of outputs of the 6 binary modules. The outputs of all the big step modules and of all the binary modules are then power combined to obtain a high power signal whose amplitude has been modulated in accordance with the program sound signal.

The thus configured amplitude modulation circuit, however, disadvantageously needs as many as 48 power amplifiers in total. Use of such a multiplicity of power amplifiers would lead to a complicated and large-scale configuration of the amplitude modulation circuit. In other words, it would be inappropriate to use such type of amplitude modulation circuit for a low output broadcaster. In addition, a power supply voltage for driving the binary modules having a lower output as compared with the big step modules must be lower than that for the big step modules, and a power supply voltage for driving relatively low output binary modules must be lower than that for relatively high output binary modules. That is, parallel use of power amplifiers having different outputs would necessitate the use of a multiplicity of power supplies whose output voltages are different.

In order to obviate the above disadvantage, use may be made of, for example, a circuit described in Japanese Patent Laid-open Pub. No. Hei 5-63458. The circuit disclosed in this official gazette is schematically shown in FIG. 5. This circuit comprises an A/D converter 10 for analog-to-digital conversion of an input program sound to generate a 12-bit digital signal; 16 digital power amplifiers 12-1, 12-1, . . . 12-16; and an analog power amplifier 14. The digital power amplifiers 12-1, 12-2, . . . 12-16 serve to amplify a carrier with frequency $f_0$ outputted from an RF (radio frequency) carrier oscillator 20.

The upper 4 bits of the 12-bit digital signal generated by the A/D converter 10 are converted into a 16-bit digital signal by means of a gate circuit 16. Each bit of the 16-bit digital signal obtained through the gate circuit 16 is correlated with any one of the power amplifiers 12-1, 12-2, . . . 12-16 and is used for on/off control of the output of a corresponding one of the power amplifiers 12-1, 12-2, . . . 12-16.

The lower 8 bits of the 12-bit digital signal generated by the A/D converter 10 are converted into an analog signal by means of a D/A (digital-to-analog) converter 18. The analog signal obtained through the D/A converter 18 is used for gain control of the power amplifier 14.

A carrier amplified by the power amplifier whose output is currently on among the power amplifiers 12-1, 12-2, . . . 12-16 and a carrier amplified by the power amplifier 14 are fed to the primary windings of a corresponding one of a total of 17 output transformers constituting a power combiner 22. The power combiner 22 is so configured that the secondary windings of these output transformers are connected in series. Accordingly, between the opposing two ends of this series connection there appears an amplitude modulated wave, namely, a signal having a waveform obtained by combining the output of the digital power amplifier whose output is now on with the output of the analog power amplifier. A BPF 24 extracts from this amplitude modulated wave only components having frequencies in the vicinity of $f_0$, and supplies the thus extracted components as an output of the broadcaster to another circuit which follows.

In this manner, the circuit depicted in FIG. 5 does not need as many as 48 power amplifiers and therefore it eliminates the necessity of preparing a multiplicity of power supplies having different output voltage specifications as power supplies for driving the respective power amplifiers. This also leads to a reduction in size of the configuration of the amplitude modulation circuit and therefore of the circuit configuration of the entire broadcaster incorporating that amplitude modulation circuit. In the circuit configuration depicted in FIG. 5, however, it is still necessary to prepare a multiplicity of power amplifiers amounting to 17. If the number of power amplifiers is decreased while maintaining such a configuration for controlling the digital power amplifiers using the upper bits of the digitized program sound signal and controlling the analog power amplifier using the lower bits, there may possibly be increased distortion at junctures between outputs of the respective power amplifiers at the time of power combining, that is, distortion resulting from quantization.

SUMMARY OF THE INVENTION

It is therefore an object of the present invention to provide an amplitude modulation circuit minimizing the possibility of the occurrence of distortion while using a smaller number of power amplifiers compared with the conventional case. This object is achieved by the improvement of a method of driving the power amplifiers. Another object of the present invention is to reduce, through the achievement of the above object, the dimensions and selling price of a circuit to which the amplitude modulation circuit is applied, for example, a broadcaster. A further object of the present invention is to stabilize the performance of the amplitude modulation circuit and to facilitate the adjustment thereof. This object is accomplished by the abolition or reduction in number of points acting in an analog manner in the circuit.

According to the first aspect of the present invention, there is provided an amplitude modulation circuit comprising means for dividing a quantized input signal into a plurality of bit groups; means for generating a plurality of phase-shift carriers having the same frequency and having phases different from one another; means for selecting, for each of the plurality of bit groups and in response to the value of the each of the plurality of bit groups, at least two phase-shift carriers from among the plurality of phase-shift carriers; a plurality of differentially switched power amplifiers correspondingly associated with the plurality of bit groups, the output of each of the plurality of differentially switched power amplifiers being differentially switched by at least two phase-shift carriers which have been selected for a corresponding one of the plurality of bit groups; and means for weighting and adding the outputs of the plurality of differentially switched power amplifiers to generate an amplitude modulated wave.

According to the second aspect of the present invention, there is provided an amplitude modulation method comprising the steps of dividing a quantized input signal into a plurality of bit groups; generating a plurality of phase-shift carriers having the same frequency and having different phases from one another; selecting, for each of the plurality of bit groups and in response to the value of each of the plurality of bit groups, at least two phase-shift carriers from among the plurality of phase-shift carriers; switching differentially, using at least two phase-shift carriers which have been selected for each of the plurality of bit groups, the outputs of the plurality of differentially switched power amplifiers individually corresponding to the plurality of bit groups; and weighting and adding the outputs of the plurality of differentially switched power amplifiers to generate an amplitude modulated wave.

In the present invention, each differentially switched power amplifier is not turned on or off by a single bit signal, but is differentially switched by at least two phase-shift carriers, making it possible to decrease the number of power amplifiers to be used compared with the prior art. This will be a merit which may lead to a reduction in the number of parts, in the size of the system configuration, and in the selling price of applied apparatuses ( e.g., a broadcaster ). Also, the differential switching of each differentially switched power amplifier by at least two phase-shift carriers which have been selected would minimize the parts acting in an analog manner and therefore contribute to the implementation of a circuit having stabilized performance and ensuring easy adjustment.

It is preferable that the weights in weighting and adding of the present invention be determined depending on the number of differentially switched power amplifiers. For instance, the weights in weighting and adding are determined depending on the number of differentially switched power amplifiers so as to ensure that ratios of power respectively allotted to the plurality of differentially switched power amplifiers result in a value of expressed as powers of 2. At that time, an output power of the differentially switched power amplifier bearing the maximum power is first determined based on a given expression.

Furthermore, it is preferable to provide means for extracting, from the amplitude modulated wave, components whose frequencies lie in the vicinity of its center frequency. A method of generating the plurality of phase-shift carriers may comprise the steps of generating a fundamental clock, generating a multiplied clock by multiplying the frequency of the fundamental clock by an integer larger than 1, and phase shifting the fundamental clock by one period of the multiplied clock. The differentially switched power amplifier may employ a configuration in which the switching element pairs to be switched by the phase-shift carriers are correspondingly associated with the above-described at least two phase-shift carriers, as well as a configuration in which the difference in output between the switching element pairs is fetched as the output of the differentially switched power amplifier. In addition, means for quantizing an input signal may be provided.

DESCRIPTION OF THE PREFERRED EMBODIMENTS

Figure 5:
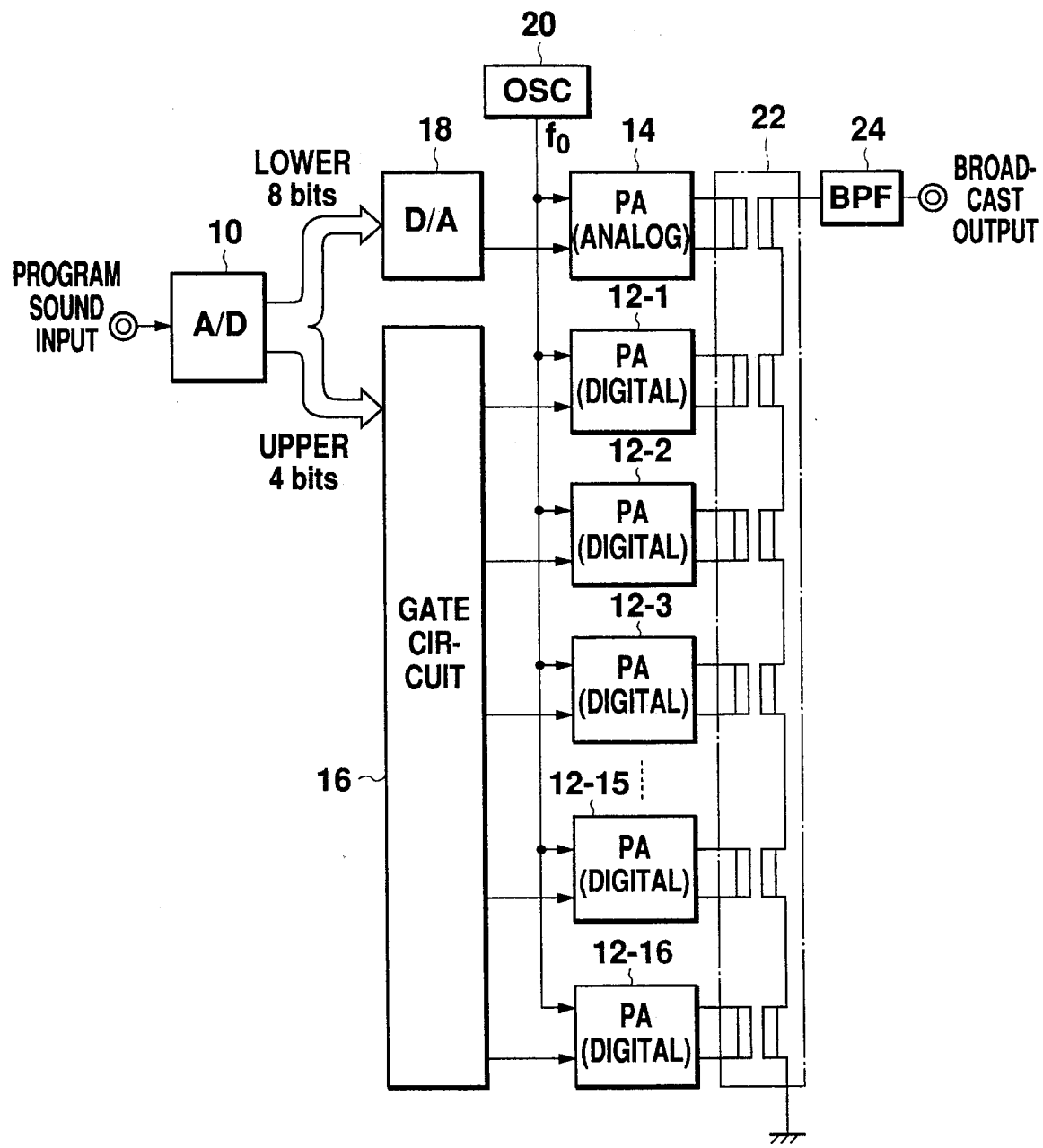
FIG. 5 is a block diagram showing a configuration of the amplitude modulation circuit according to a prior art.

The present invention will now be described by way of non-limitative preferred embodiments thereof with reference to the accompanying drawings. It is to be noted that the same elements as shown in FIG. 5 are designated by the same reference numerals and are not further explained.

Figure 1:
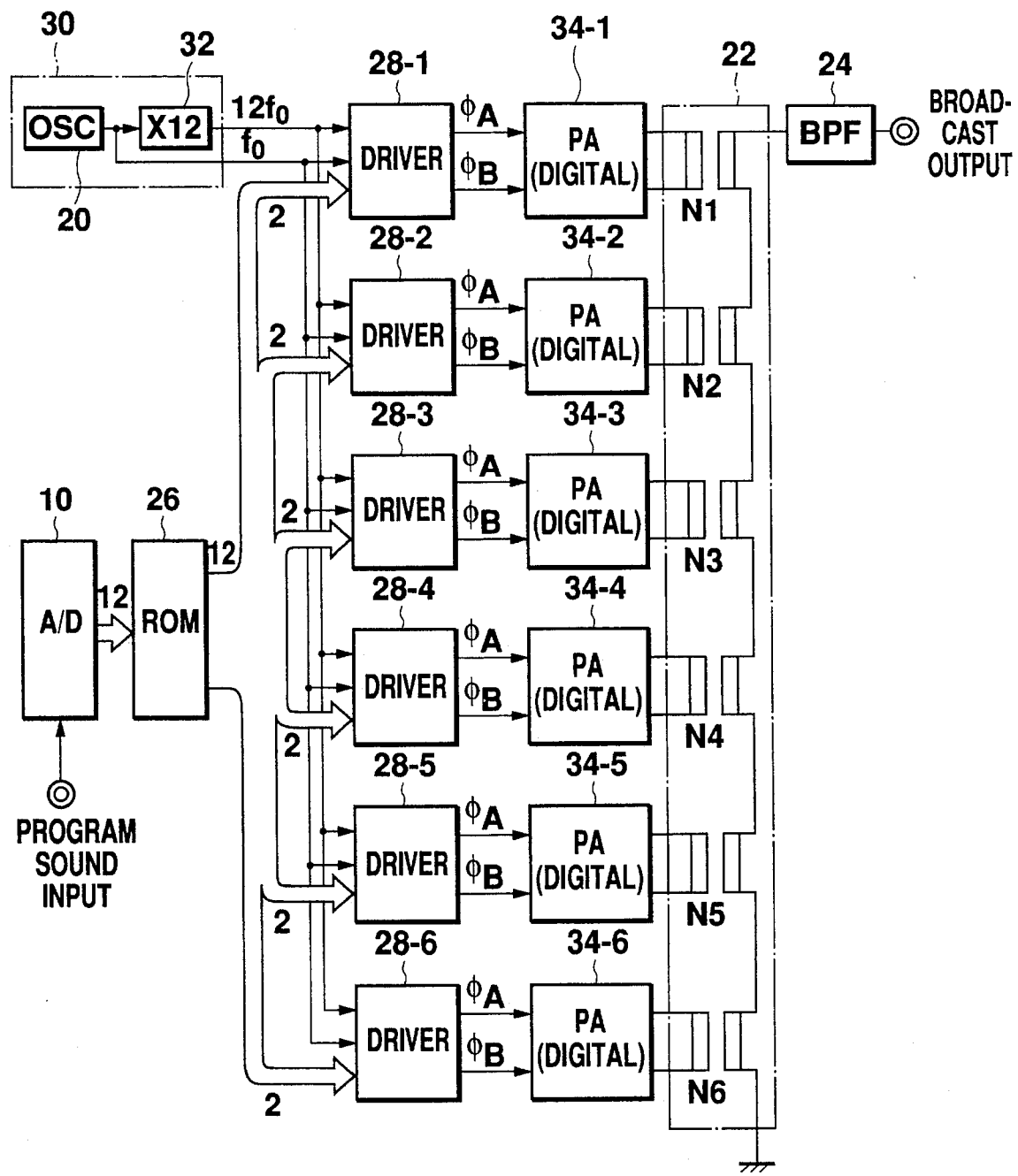
FIG. 1 is a block diagram showing a configuration of an amplitude modulation circuit according to an embodiment of the present invention.

Referring first to FIG. 1 there is depicted a configuration of an amplitude modulation circuit according to an embodiment of the present invention. An A/D converter 10 serves to convert an input program sound signal into a 12-bit digital signal. A ROM (read only memory) 26 divides the thus obtained 12-bit digital signal into six bit groups each consisting of two bits. These six bit groups are routed to corresponding drivers 28-1, 28-2, ... 28-6. The drivers 28-1, 28-2, ... 28-6 also receive a carrier of a frequency $f_0$ and a clock of a frequency $12 \cdot f_0$ from an RF carrier oscillating section 30. In this embodiment the RF carrier oscillating section 30 includes an RF carrier oscillator 20 similar to that used in the prior art described above, and a 12-times circuit 32 which generates the clock by multiplying the output frequency of the RF carrier oscillator 20 by 12.

Figure 2:
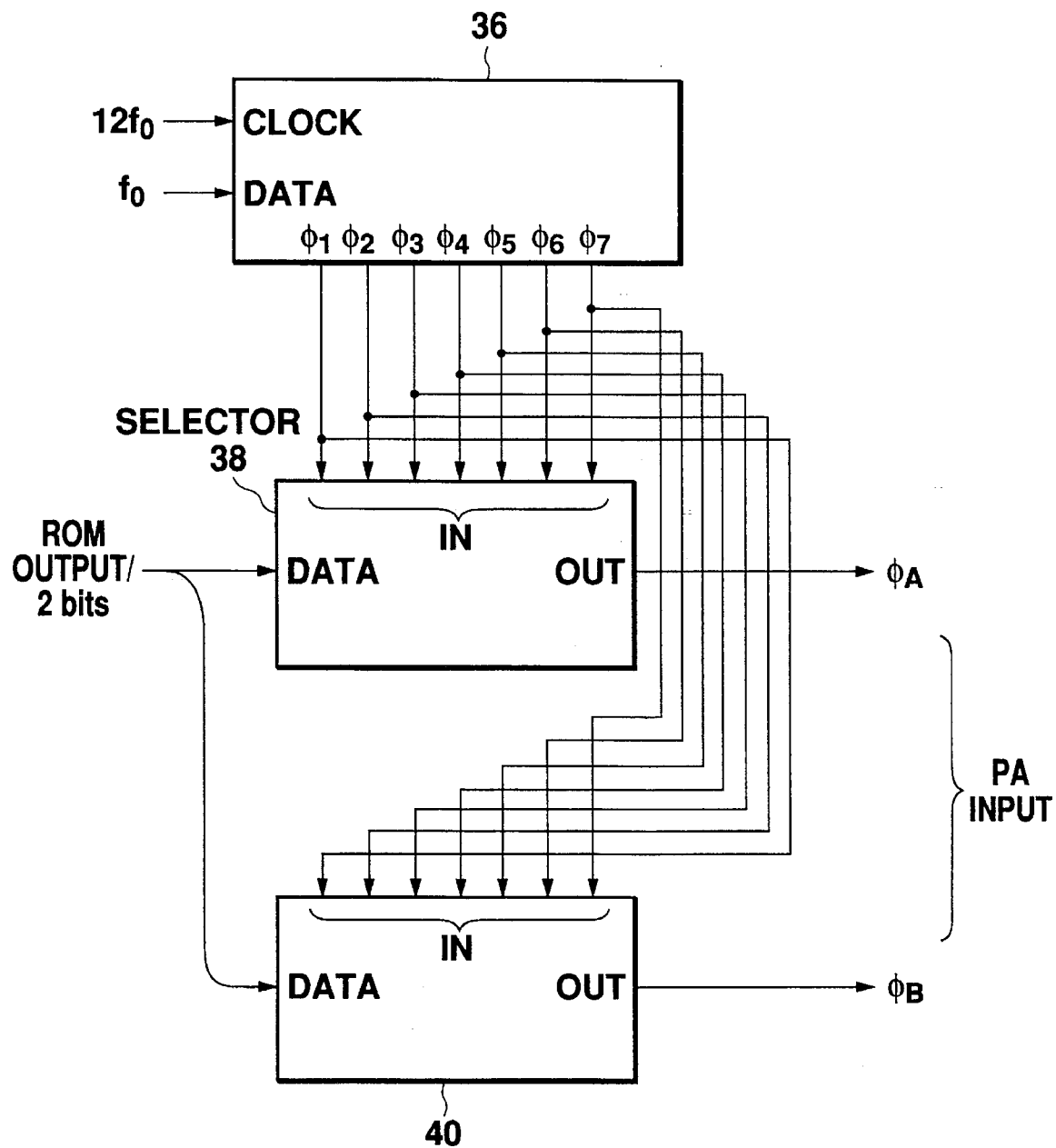
FIG. 2 is a block diagram showing a configuration of a driver in this embodiment.

This embodiment further comprises six differentially switched power amplifiers 34-1, 34-2, ... 34-6. Each of the power amplifiers 34-1, 34-2, ... 34-6 is correspondingly associated with one of the drivers. The power amplifiers 34-1, 34-2, ..., 34-6 are differentially switched by two different phase-shift carriers $\phi_A$ and $\phi_B$ generated by corresponding drivers 28-1, 28-2, ... 28-6. The resultant amplified carriers are serially combined by a power combiner 22 which follows. An amplitude modulated wave derived from the power combiner 22 is filtered by a BPF 24 and then fed as an output of the broadcaster to the following circuit not shown. Referring to FIG. 2 there is depicted a configuration of each of the drivers 28-1, 28-2, ... 28-6 in this embodiment. As shown, each driver includes a shifter 36, and a couple of selectors 38 and 40.

Figure 3:
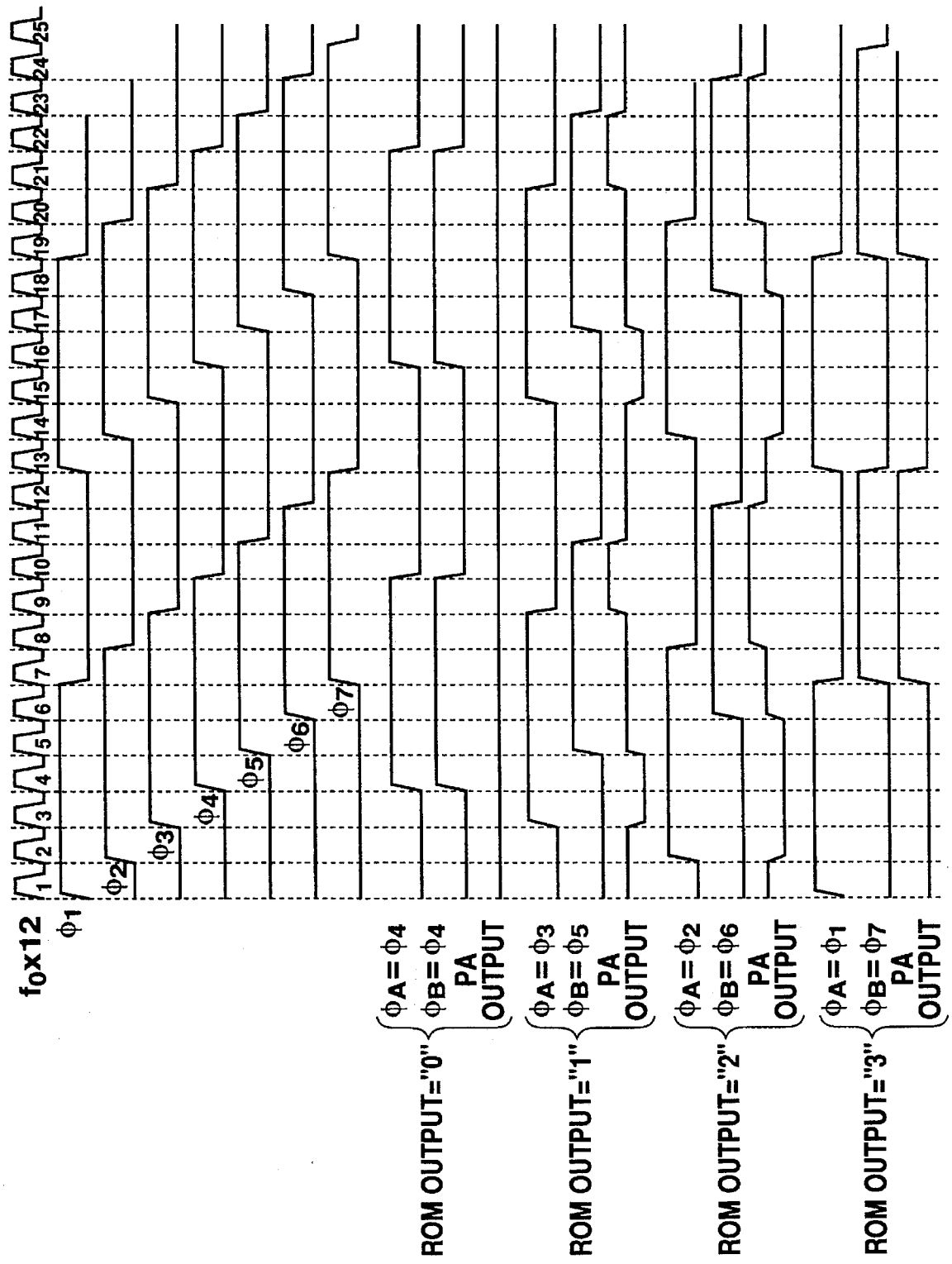
FIG. 3 is a timing chart showing an action of the driver in this embodiment.

By use having a clock having a frequency $12f_0$ fed from the RF carrier oscillating section 30, the shifter 36 phase-shifts a carrier of a frequency $f_0$ also supplied from the RF carrier oscillating section 30, to generate seven different phase-shift arriers $\phi_1$ to $\phi_7$ shown in FIG. 3. Phases of the phase-shift carriers $\phi_1$ to $\phi_7$ are shifted in sequence from one another by the amount of phase corresponding to one period of the clock. The thus generated phase-shift carriers $\phi_1$ to $\phi_7$ are delivered to the selectors 38 and 40.

In response to the value of a 2-bit digital signal distributed from the ROM 26, each of the selectors 38 and 40 selects a respective one from the phase-shift carriers $\phi_1$ to $\phi_7$. Two different phase-shift carriers $\phi_A$ and $\phi_B$ which have been selected are provided as the output to the corresponding power amplifier. If the value of the 2-bit digital signal distributed from the ROM 26 is for example 0 in decimal notation, then the selector 38 issues a phase-shift carrier $\phi_4$ as the phase-shift carrier $\phi_A$ and the selector 40 issues a phase-shift carrier $\phi_4$ as the phase-shift carrier $\phi_B$. The logic for the selection by the selectors 38 and 40 is summarized in the following table.

TABLE 1

| ROM output bit | Selector Output $\phi_A$ | Selector Output $\phi_B$ |
|---|---|---|
| 0 | $\phi_4$ | $\phi_4$ |
| 1 | $\phi_3$ | $\phi_5$ |
| 2 | $\phi_2$ | $\phi_6$ |
| 3 | $\phi_1$ | $\phi_7$ |

Figure 4:
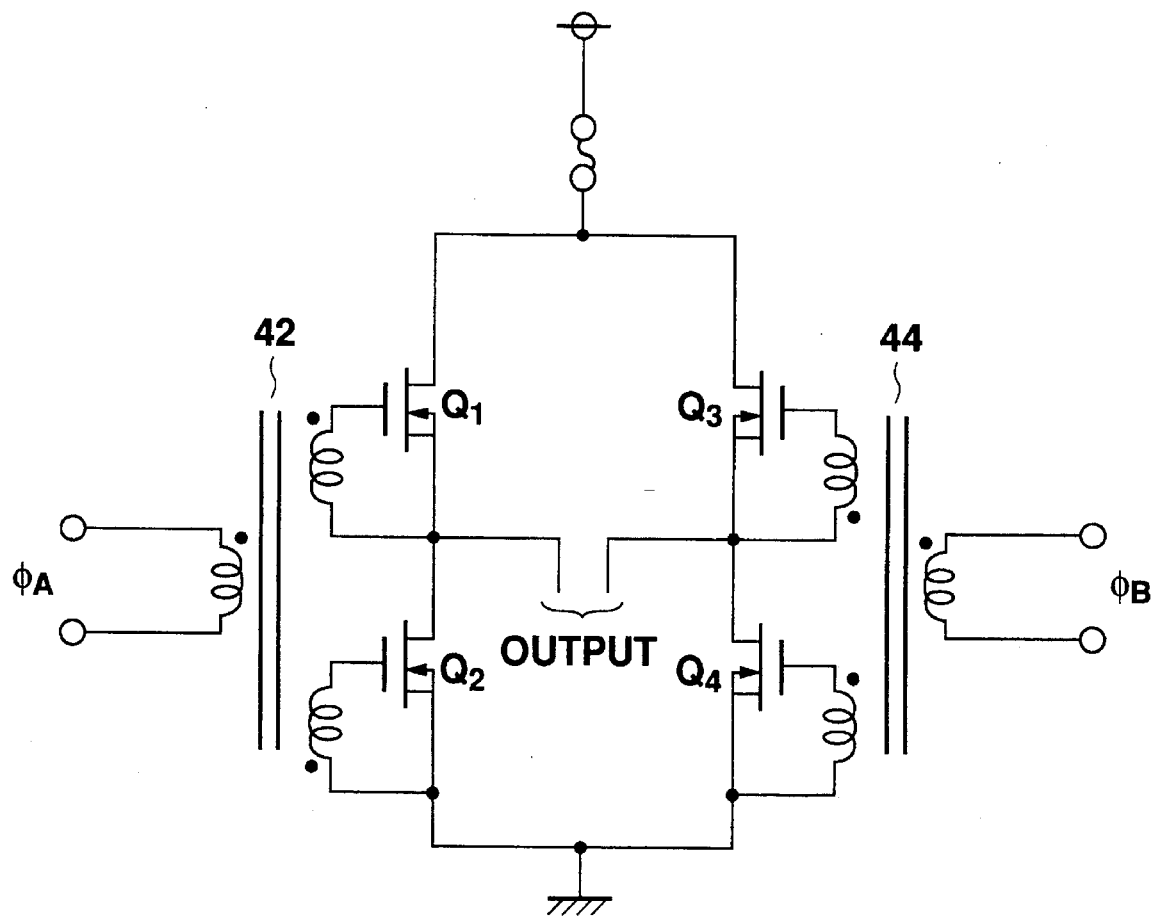
FIG. 4 is a circuit diagram showing a configuration of a differentially switched power amplifier in this embodiment.

Referring finally to FIG. 4 there is depicted an internal configuration of each of the power amplifiers 34-1, 34-2, ... 34-6. The power amplifier shown in this diagram includes a couple of MOS (metal-oxide semiconductor) transistors $Q_1$ and $Q_2$ controlled by a phase-shift carrier $\phi_A$ imparted through a transformer 42, and a couple of MOS transistors $Q_3$ and $Q_4$ controlled by a phase-shift carrier $\phi_B$ imparted through a transformer 44. In consequence, the shown power amplifier is differentially switched by the phase-shift carriers $\phi_A$ and $\phi_B$. As discussed above, the phase-shift carriers $\phi_A$ and $\phi_B$ have been selectively determined by the selectors 38 and 40 in response to the value of the 2-bit digital signal distributed from the ROM 26, and therefore the output waveform of the power amplifier can take forms indicated as "PA output" in the lower half of FIG. 3.

The outputs of the power amplifiers 34-1, 34-2, ... 34-6 are weighted in accordance with number of power amplifiers. More specifically, based on the following expression (1), an output power $P_{0max}$ of the power amplifier bearing the maximum power is so determined that ratios of power allotted to the respective power amplifiers result in the value of expressed as powers of 2.

$$M_x = (2^M - 1)/(2^{M-1}) \quad (1)$$

$$P_{0max} = P_0 / M_x \quad (2)$$

where $P_0$ is a peak power at 100% modulation to be implemented by the cooperation of all the power amplifiers, and M is the number of power amplifiers.

In the above example, the number of power amplifiers is six (M=6). Assuming that the output of the broadcaster at non-modulation is 120 watts, the peak power at 100% modulation will reach four times that power, as is well known to those skilled in the art, that is, 480 watts. Accordingly, when M=6 and $P_0$=480 are substituted into the above expression, $P_{0max}$ will result in 243.779. Providing that $P_{0max}$ is allotted to the first power amplifier 34-1, ½ of that power to the second power amplifier 34-2, ... and 1/32 of that power to the sixth power amplifier, possible output power from the power amplifiers 34-1, 34-2, ... 34-6 will be $P_1$=243.779 W, $P_2$=121.889 W, $P_3$=60.945 W, $P_4$=30.472 W, $P_5$=15.236 W, and $P_6$=7.618 W, respectively. The power amplifiers 34-4, 34-2, ... 34-6 are each weighted so as to implement such outputs. In accordance with this, the numbers of turns $N_1$ to $N_6$ of the respective output transformers constituting the power combiner 22 are also set to $N_1$=6, $N_2$=12, $N_3$=24, $N_4$=48, $N_5$=96, and $N_6$=192, respectively.

The configuration of this embodiment enables digital amplitude modulation to be implemented by using a reduced number of power amplifiers compared with the conventional case. In other words, by virtue of the configuration in which a 12-bit quantized program sound signal is divided into six bit groups each consisting of two bits so that corresponding power amplifiers 34-1, 34-2, ... 34-6 are differentially switched by phase-shift carriers $\phi_A$ and $\phi_B$ which have been selected in accordance with the values of the respective bit groups, a circuit can be implemented having a performance equivalent or superior to the prior art, despite the use of a lower number of power amplifiers, for instance, only six. This will contribute to the implementation of reduction in the number of components, in size of the circuit configuration, and in selling prices. In addition, essentially no parts acting in an analog manner exist in the circuit configuration, leading to stable performance and easy adjustment. This would be advantageous to the future spread in use.

Although envisaged in the above-described embodiment is an amplitude modulation circuit having 480 W peak power at 100% modulation, the present invention is not intended to be confined to such an output. It is also natural that the number of switching power amplifiers should not be limited to six, and that the detailed configuration of the driver should not be limited to the configuration using the above-described shifter and selectors. In addition, it is to be construed that the number of phase-shift carriers to differentially switch the respective power amplifiers is not restricted to two, and that the configuration of the power amplifier is not restricted to the one shown in FIG. 4.

What is claimed is:

1. An amplitude modulation circuit comprising:

means for dividing a quantized input signal into a plurality of bit groups;

means for generating a plurality of phase-shift carriers having the same frequency and having phases different from one another;

means for selecting, for each of said plurality of bit groups and in response to the value of said each of said plurality of bit groups, at least two phase-shift carriers from among said plurality of phase-shift carriers;

a plurality of differentially switched power amplifiers correspondingly associated with said plurality of bit groups, the output of each of said plurality of differentially switched power amplifiers being differentially switched by at least two phase-shift carriers which have been selected for corresponding one of said plurality of bit groups; and means for weighting and adding the outputs of said plurality of differentially switched power amplifiers to generate an amplitude modulated wave.

2. An amplitude modulation circuit according to claim 1, wherein weight at the time of adding and weighting is determined depending on the number of said plurality of differentially switched power amplifiers.

3. An amplitude modulation circuit according to claim 2, wherein weight at the time of adding and weighting is determined depending on the number of said plurality of differentially switched power amplifiers so that ratios of power allotted among said plurality of differentially switched power amplifiers result in values of expressed as powers of 2.

4. An amplitude modulation circuit according to claim 3, wherein an output power $P_{0max}$ of one of said plurality of differentially switched power amplifiers which bears the maximum power is determined based on the following expression:

$$M_x = (2^M - 1)/(2^{M-1})$$

$$P_{0max} = P_0/M_x$$

where $P_0$ is a peak power at 100% modulation to be implemented by the cooperation of said plurality of differentially switched power amplifiers; and M is the number of said plurality of differentially switched power amplifiers.

5. An amplitude modulation circuit according to claim 1, further comprising:

means for extracting, from an amplitude modulated wave, frequency components lying in the vicinity of its center frequency.

6. An amplitude modulation circuit according to claim 1, wherein said means for generating a plurality of phase-shift carriers includes:

means for generating a fundamental clock;

means for generating a multiplied clock by multiplying said fundamental clock by an integer larger than 1; and means for generating said plurality of phase-shift carriers by phase shifting said fundamental clock by one period of said multiplied clock.

7. An amplitude modulation circuit according to claim 1, wherein said plurality of differentially switched power amplifiers each include at least two switching element pairs correspondingly associated with said at least two phase-shift carriers, said at least two switching element pairs each being switched by a corresponding one of said at least two phase-shift carriers; the difference in the output between said at least two switching element pairs resulting in the output of each of said plurality of differentially switched power amplifiers.

8. An amplitude modulation circuit according to claim 1, further comprising:

means for generating said quantized input signal by quantizing an input signal.

9. An amplitude modulation method comprising the steps of:

dividing a quantized input signal into a plurality of bit groups;

generating a plurality of phase-shift carriers having the same frequency and having phases different from one another;

selecting, for each of said plurality of bit groups and in response to the value of said each of said plurality of bit groups, at least two phase-shift carriers from among said plurality of phase-shift carriers;

switching differentially, by at least two phase-shift carriers which have been selected for each of said plurality of bit groups, the outputs of said plurality of differentially switched power amplifiers individually corresponding to said plurality of bit groups; and weighting and adding the outputs of said plurality of differentially switched power amplifiers to generate an amplitude modulated wave.

\* \* \* \* \*